United States Patent [19]

Scheve

[11] 4,198,238
[45] Apr. 15, 1980

[54] PHOTOPOLYMERIZABLE COMPOSITION

[75] Inventor: Bernard J. Scheve, Wilmington, Del.

[73] Assignee: Hercules Incorporated, Wilmington, Del.

[21] Appl. No.: 944,455

[22] Filed: Sep. 21, 1978

Related U.S. Application Data

[63] Continuation-in-part of Ser. No. 917,999, Jun. 22, 1978.

[51] Int. Cl.² ........................... G03C 5/00; G03C 1/68
[52] U.S. Cl. ..................................... 430/286; 430/306
[58] Field of Search ............... 96/115 R, 115 P, 87 R, 96/35.1

[56] References Cited

U.S. PATENT DOCUMENTS

| | | | |
|---|---|---|---|
| 2,760,863 | 8/1956 | Plambeck | 96/115 R |
| 3,794,494 | 2/1974 | Kai et al. | 96/115 P |
| 3,858,510 | 1/1975 | Kai et al. | 96/35.1 |
| 3,960,572 | 6/1976 | Ibata et al. | 96/115 P |

*Primary Examiner*—Won H. Louie, Jr.
*Attorney, Agent, or Firm*—Richard J. Sheridan

[57] ABSTRACT

Photopolymerizable compositions containing a mixture of a liquid unsaturated polyester and a liquid urethane-linked polymer can be used to prepare printing plates having improved solvent resistance and washout characteristics.

6 Claims, No Drawings

PHOTOPOLYMERIZABLE COMPOSITION

This application is a continuation-in-part of my co-pending application Ser. No. 917,999, filed June 22, 1978.

BACKGROUND OF THE INVENTION

Compositions capable of being converted under the influence of actinic light to solid, insoluble, tough structures have become increasingly important in the preparation of printing plates. U.S. Pat. No. 2,760,863 to Plambeck is related to such compositions. In the process of the Plambeck patent, printing plates are produced directly by exposing to actinic light through an image bearing transparency a layer of an essentially transparent polymerizable composition containing an addition polymerization initiator which composition cross-links on exposure to actinic light. The layer of polymerizable composition, which is supported on a suitable support, is exposed until substantial polymerization of the composition occurs in the exposed areas while substantially no polymerization occurs in the unexposed areas. The unchanged material in the latter areas is then removed, as by treatment with a suitable solvent in which the polymerized composition in the exposed areas is insoluble. The result is a raised relief image, corresponding to the transparent areas in the transparency, which is suitable for use as a printing plate, as in letterpress and dry off-set work Photopolymerizable layers of the type described by Plambeck generally are prepared from polymeric components which are soluble in organic solvents. Due to the toxicity, high volatility and generally low flash point of low cost organic solvents, their use often gave rise to hazardous conditions. As a consequence, further research was directed toward the development of photopolymer compositions which are soluble in water or aqueous alkali. In U.S. Pat. Nos. 3,794,494 to Kai et al and 3,960,572 to Ibata et al, the disclosures of which are both hereby incorporated by reference, water or aqueous alkali dispersible compositions are described which are suitable for use in rigid or elastic flexographic printing plate preparation. These compositions comprise polyester-polyether urethane-linked block polymers containing acrylate or methacrylate end groups (U.S. Pat. No. 3,960,572), or unsaturated polyesters (U.S. Pat. No. 3,794,494) in combination with unsaturated monomers and a photopolymerization initiator. However, the individual compositions of U.S. Pat. No. 3,960,572 and U.S. Pat. No. 3,794,494 generally are not suitable for making printing plates to be used with the type of inks containing acrylate monomers with no solvents which are cured by ultraviolet radiation. Such ultraviolet inks require soft printing plates to provide maximum ink transfer and print quality. Soft plates made from unsaturated polyester compositions generally have poor physical properties and do not withstand the printing or plate cleaning processes, while the polyester-polyether urethane-linked block polymer formulations produce plates which swell and disintegrate when used with such ultraviolet inks and plate cleaning materials.

Summary Of The Invention

According to the invention, there are provided photopolymer compositions containing a mixture of a liquid unsaturated polyester and a liquid urethane-linked polymer and, more particularly, to liquid, water-dispersible compositions which, when fully cured by actinic radiation, give cross-linked structures having better physical properties than fully cured formulations containing only the unsaturated polyester component, and in addition have better solvent resistance and washout characteristics in automatic washout equipment than fully cured compositions containing only the urethane-linked component. These improvements in physical properties and solvent resistance make the compositions of this invention well suited for use in preparing printing plates which are to be used with inks cured by ultraviolet radiation. This invention also relates to photopolymer elements, for example, printing plates embodying a layer of such compositions, to processes for making printing reliefs from such elements, and to coating applications.

The photopolymerizable compositions of this invention comprise, in general, (1) a liquid unsaturated polyester made from an alcoholic component comprising at least one polyol, and an acid or ester component comprising at least one dicarboxylic acid, its anhydride, or its methyl or ethyl diester, at least one of said alcoholic or acid components being unsaturated, which unsaturated polyester may have ester, carboxyl or hydroxyl end groups; (2) a liquid polyester-polyether urethane-linked block polymer, polyether urethane-linked polymer or polyester urethane-linked polymer having two reactive terminally unsaturated end groups generally of the acrylate or methacrylate type (see U.S. Pat. No. 3,960,572); (3) at least one addition polymerizable monomer; (4) at least one photoinitiator; and (5) at least one thermal polymerization inhibitor.

Description Of The Preferred Embodiments

The photopolymer mixtures of this invention comprise (1) about 10% to about 45% (preferably about 30% to about 40%) by weight of a liquid polymer containing at least two terminal olefinically unsaturated groups linked by a carbamoyl (i.e., urethane) linkage to polyether, polyester (which may be saturated or contain unsaturation in the acid or polyol components), block polyester-polyether polymers, or other hydroxy terminated polymers, said polymers (hereinafter referred to as urethane-linked polymers) having a molecular weight ($M_n$) of about 5,000–26,000 and a room temperature viscosity of about 100,000–300,000 cps and having the structure

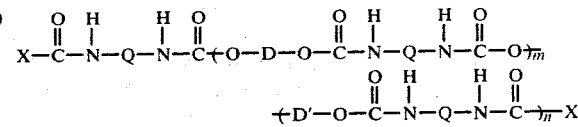

where m and n are integers from 0 to 10 and m+n is at least 1, D and D' are polymeric backbones selected from hydroxy terminated homopolymers of butadiene, isoprene, chloroprene, styrene, isobutylene, ethylene, epichlorohydrin, ethylene glycol, propylene glycol or neopentyl glycol; or hydroxy terminated copolymers of butadiene and acrylonitrile, butadiene and styrene, butadiene and isoprene, ethylene and neohexene, isobutylene and styrene, isobutylene and acrylonitrile; hydroxy terminated polyesters of saturated or unsaturated dibasic acids and saturated or unsaturated glycols; hydroxy terminated polyester-polyether block copolymers; or combinations of such polymeric backbones; Q is a radical selected from C$_4$–C$_{10}$ alkylene, C$_5$–C$_8$ cycloalkylene, arylene containing 1–2 rings, C$_6$–C$_{12}$ alkarylene, and alkylene oxyalkylene radicals containing 4–8 carbon atoms and 1–3 oxygen atoms; X is selected from the radical of an alcohol containing one to three ethylenically unsaturated bonds from which a hydrogen atom has been removed from the hydroxyl group, the radical of a primary or secondary alkyl or aralkyl amine containing unsaturation in the alkyl group, from which a hydrogen atom has been removed from the amine group, or the radical of a carboxylic acid selected from acrylic acid and methacrylic acid from which the hydrogen atom on the carboxyl group has been removed; (2) about 10% to about 45% (preferably about 20% to about 30%) by weight of a liquid unsaturated polyester polymer of molecular weight (M$_n$) of about 2000–8000 and a viscosity of about 1000–3000 cps at 100° C. (100,000–700,000 cps at room temperature), said unsaturated polyester being produced from an alcoholic component comprising at least one polyol, and an acid component selected from at least one dicarboxylic acid, dianhydride or diester, at least one of said alcoholic and acid components being unsaturated; (3) about 5% to about 55% (preferably about 10% to about 30%) by weight of an ethylenically unsaturated monomer selected from acrylonitrile, styrene, methyl substituted styrenes and monomers having unsaturation in the form of at least one

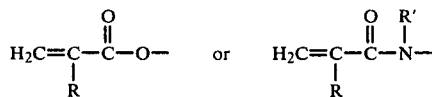

group where R is hydrogen or C$_1$-C$_3$ alkyl, and R' is hydrogen, C$_1$-C$_3$ alkyl or phenyl; (4) about 0.05% to about 4% by weight of a photoinitiator; and (5) about 0.01% to about 0.2% by weight of a thermal polymerization inhibitor, all percentages being based on the total weight of the liquid polymer components and the ethylenically unsaturated monomer component.

The liquid urethane-linked polymers which can be used in this invention can further be described as follows:

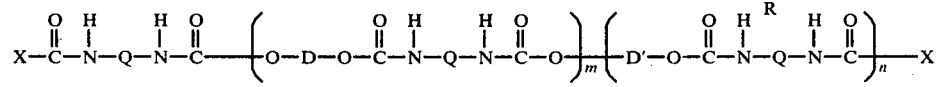

where m and n are integers from 0 to 10 and m+n is at least 1, D and D' are polymeric backbones having number average molecular weights in the range of about 500 to about 20,000, preferably about 500 to about 2,000, and are selected from hydroxy terminated homopolymers of butadiene, isoprene, chloroprene, styrene, isobutylene, ethylene, epichlorohydrin, ethylene glycol, propylene glycol or neopentyl glycol; or hydroxy terminated copolymers of butadiene and acrylonitrile, butadiene and styrene, butadiene and isoprene, ethylene and neohexene, isobutylene and styrene, isobutylene and acrylonitrile; or hydroxy terminated polyesters of saturated or unsaturated dibasic acids and saturated or unsaturated glycols; or combinations of such polymeric backbones; Q is a radical selected from C$_4$-C$_{10}$ alkylene, C$_5$-C$_8$ cycloalkylene, arylene containing 1-2 rings, C$_6$-C$_{12}$ alkarylene, and alkylene oxyalkylene radicals containing 4–8 carbon atoms and 1–3 oxygen atoms; X is the radical of an alcohol containing one to three ethylenically unsaturated bonds from which a hydrogen atom has been removed from the hydroxyl group, the radical of a primary or secondary alkyl or aralkyl amine containing unsaturation in the alkyl group, from which a hydrogen atom has been removed from the amine group, or the radical of a carboxylic acid selected from acrylic acid and methacrylic acid from which the hydrogen atom on the carboxyl group has been removed.

The liquid unsaturated polyesters useful in this invention may be an ester, carboxyl or hydroxyl terminated polyester prepared from a dibasic acid or ester and a glycol, the dibasic acid, glycol or both containing unsaturation. Such polyesters may be prepared using, e.g., fumaric or itaconic acids, or 1,4-butenediol or trimethylolpropane monoallyl ether. As indicated previously, the molecular weight of these liquid unsaturated polyesters is between 2000 and 8000.

The ethylenically unsaturated monomer components of the compositions of this invention have their unsaturation in the form of acrylonitrile, methacrylonitrile, styrene, methyl-substituted styrene or compounds containing one or more

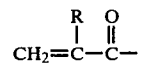

groups, wherein R is hydrogen or a C$_1$-C$_3$ alkyl group.

Useful monofunctional ethylenically unsaturated monomers include acrylonitrile, methacrylonitrile, styrene, alpha-methylstyrene, alpha-p-dimethylstyrene, acrylic acid, methacrylic acid, esters of acrylic acid and methacrylic acid containing up to 22 carbon atoms, acrylamide, mono- and di-N alkyl-substituted acrylamides and methacrylamides containing up to 10 carbon atoms in the alkyl group, and diacetoneacrylamide.

Useful trifunctional monomers include 1,3,5-triacryloylhexahydro-1,3,5-triazine or 1,3,5-triallylcyanurate.

Suitable difunctional monomers may be defined by the structural formula:

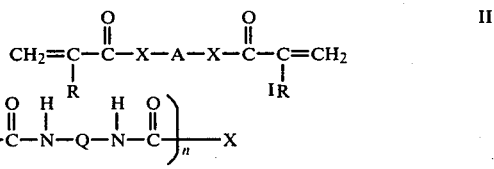

wherein X is —HN— or —O—, A is alkylene, substituted alkylene o  alkylene oxyalkylene, and R is hydrogen or C$_1$-C$_3$ alkyl.

A preferred monomer having this formula is N,N'-oxydimethylene-bis(acrylamide).

When X in formula II is —NH— but A is alkylene or substituted alkylene, this is descriptive of another preferred monomer, N,N'-methylene-bis (acrylamide). This compound is one member of a valuable group of monomers represented by compounds having the formula:

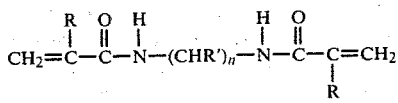   III

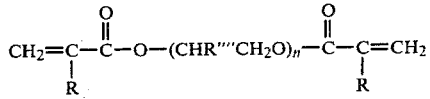   V wherein R is hydrogen or a $C_1$-$C_3$ allyl group, R' is hydrogen, or a $C_1$-$C_3$ alkyl group or phenyl, n is 1 to 6, and the total number of carbon atoms in $(CHR')_n$ is no more than ten.

Representative of compounds of formula III above are N,N'-methylene bis (acrylamide), N,N'-methylene-bis (methacrylamide), N,N'-methylene bis (2-ethylacrylamide), N,N'-methylene-bis-(2-propylacrylamide), N,N'-1,6-hexamethylene-bis acrylamide, N,N'-ethylidene-bis acrylamide, N,N'-ethylidene-bis methacrylamide, N,N'-benzylidene-bis acrylamide, N,N'-butylidene-bis methacrylamide and N,N'-propylidene-bis acrylamide. These compounds may be prepared by conventional reactions well known in the art, for example, see U.S. Pat. No. 2,475,846.

Other useful monomers are those wherein X in formula II is —O— and A is alkylene or substituted alkylene. These compounds are di-, tri- and tetra-acrylates of certain polyhydric alcohols. These acrylates may be illustrated by the general formula:

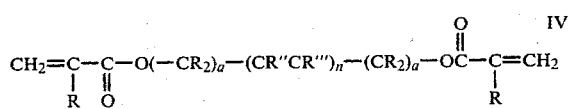   IV wherein R is hydrogen or a $C_1$-$C_3$ alkyl group, a is 0 or 1, R' is hydrogen, a $C_1$-$C_3$ allyl group, OH, —$CH_2OH$,

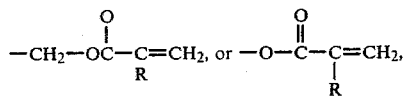

R" is hydrogen, $C_1$-$C_3$ alkyl, —OH, —$CH_2OH$,

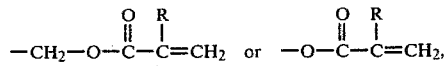

R''' is hydrogen, a $C_1$-$C_3$ alkyl group, n is 1 to 6 and the total of carbon atoms in —$(CR''CR''')_n$— is no more than eleven. Representative of these compounds are ethylene glycol diacrylate, ethylene glycol dimethacrylate, ethylene glycol di(2-ethylacrylate), ethylene glycol di(2-propylacrylate), 1.5-pentanediol dimethacrylate, glycerol diacrylate, glycerol triacrylate, trimethylolpropane triacrylate, trimethylolpropane trimethacrylate, pentaerythritol diacrylate, pentaerythritol triacrylate, pentaerythritol tetramethacrylate, and pentaerythritol tetracrylate.

Closely related to the preceding acrylates are those which are derived from di-, tri- and tetra-ethylene glycol and di- and tri-propylene glycol. These compounds are those of formula II wherein X is —O— and A is alkylene oxy alkylene, and they may be more specifically illustrated by the formula:

wherein R is hydrogen or a $C_1$-$C_3$ alkyl group, R'''' is hydrogen or methyl, n is 2 to 10 when R'''' is hydrogen and is 2 to 3 when R'''' is methyl. Representative of these compounds are diethylene glycol diacrylate, diethylene glycol dimethacrylate, triethylene glycol diacrylate, triethylene glycol dimethacrylate, tetraethylene glycol diacrylate, tetraethylene glycol dimethacrylate, dipropylene glycol diacrylate, dipropylene glycol dimethacrylate, tripropylene glycol diacrylate and tripropylene glycol dimethacrylate.

Monofunctional monomers may also be employed in combinations with the polyunsaturated monomers. The amount of monomer or monomers used to effect cross-linking of the polymer component of the compositions of this invention will be from about 5 to 55%, preferably from about 10 to about 30%, by weight.

The specific photoinitiator used will depend upon the other components as well as the light source employed. Typical photoinitiators are the benzoins, such as benzoin, benzoin methyl ether, benzoin ethyl ether, benzoin isobutyl ether, benzoin isopropyl ether, alpha-methylbenzoin, alpha-ethylbenzoin, alpha-phenylbenzoin, alpha-allylbenzoin, etc.; the anthraquinones, such as anthraquinone, chloroanthraquinone, methylanthraquinone, ethylanthraquinone, etc.; the diketones, such as benzil, diacetyl, etc.; the 2,2-dialkoxy substituted acetophenones, such as 2,2-diethoxy acetophenone, etc.; the 2,2-dialkoxy-2-phenyl substituted acetophenones, such as 2,2-dimethoxy-2-phenylacetophenone, etc.; the disulfides, such as diphenyldisulfide, tetraethylthiuramidsulfide, etc.; 2-naphthalene-sulfonyl chloride, etc. The amount of photoinitiator may be from about 0.05 to about 10%, preferably from about 0.1 to about 5%, by weight based on the polymer in the photopolymer composition.

For the purpose of inhibiting premature cross-linking during thermal processing and storage of the photopolymer compositions of this invention, the incorporation of a thermal polymerization inhibitor or inhibitors is desirable. Such inhibitors also are well known in the art, and they are exemplified by di-t-butyl-p-cresol, hydroquinone monomethyl ether, pyrogallol, quinone, hydroquinone, methylene blue, t-butyl catechol, hydroquinone monobenzyl ether, methyl hydroquinone, amyl quinone, amyloxy hydroquinone, n-butyl phenol, phenol, hydroquinone monopropyl ether, phenothiazine and nitrobenzene, used separately or in combination. When used in an amount within the range of from about 0.01 to about 2% by weight of the polymer, these stabilizers are quite effective in preventing cross-linking of the photopolymer composition during processing and storage. During exposure such amounts of stabilizer also delay and, thus, prevent cross-linking due to scattered light in the nonexposed areas of the compositions, but do not greatly interfere with or delay the cross-linking of the composition in strongly exposed areas, thus, aiding in formation of a plate of optimum depth and surface configuration.

When the photopolymer elements in this invention are exposed to actinic light at a wavelength of from about 3000 to 4000 A through a photographic negative or positive, the polymer beneath the exposed areas becomes insolubilized, whereas the polymer beneath the unexposed areas remains water dispersible. Subsequent washing of the plate removes the dispersible polymer, leaving a replica of the negative or positive in relief. Washing will normally be carried out with dilute aqueous solution of an anionic or nonionic detergent. Anionic detergents such as alpha-olefin sulfonates, alkylaryl sulfonates, lauryl sulfate, alkyl esters of sulfosuccinic acid, or sulfated ethylene oxide condensates of alkyl phenols or fatty alcohols, and nonionic detergents such as alkyl phenol, fatty alcohol or fatty acid ethylene oxide condensates may be used. Alpha-olefin sulfonates are particularly useful. Detergent concentrates of about 0.2 to 2% will normally be employed, generally at temperatures of 25°–60° C. Washing may frequently be accelerated by brushing or scrubbing. In large-scale work, application of the water solvent will advantageously be carried out by means of jets or sprays. In some instances, it may be helpful to use minor quantities of organic solvents such as the short chain aliphatic alcohols and ketones. Suitable solvents of these types include methanol, ethanol, and acetone, and they generally will be used in amounts no greater than 25–35%, preferably less than 1–5% of the water or aqueous detergent developer. Following development of the plate, residual surface water and any organic solvent which also might be present may be removed by passing a current of warm air over the relief.

The printing reliefs made in accordance with this invention can be used in all classes of printing, but are most applicable to those wherein a distinct difference in height between printing and nonprinting areas is required. These classes include those in which the ink is carried by the raised portion of the relief, such as in dry off-set printing and ordinary letterpress printing. Because of the flexibility, abrasion resistance, resilience, and solvent resistance, relief plates prepared using these compositional blends are particularly useful for printing applications in which ultraviolet curing inks are employed.

This invention is illustrated by the following examples in which all parts are by weight unless otherwise indicated.

EXAMPLE 1

This example illustrates the preparation of a polyester-polyether urethane-linked block copolymer, the preparation of an unsaturated polyester, and the use of a photopolymerizable composition containing a blend of the polyester-polyether urethane-linked block copolymer and the unsaturated polyester in making printing plates.

A polyester-polyether urethane-linked block copolymer (I) is prepared by reacting 26.1 g. of a mixture of 2,4-toluene diisocyanate and 2,6-toluene diisocyanate (in an 80/20 weight ratio respectively) under nitrogen with 200 g. of a hydroxyl terminated polyethylene adipate (molecular weight approximately 450) at 70° C. with stirring in the presence of 0.1 g. dibutyltin dilaurate for two hours. The resulting isocyanate terminated polyester is further reacted with 100 g. of polypropylene glycol diol (molecular weight approximately 1000) at 70° C. for two hours. Then 300 g. of the resulting polyester-polyether urethane-linked block polymer (I) is reacted at 70° C. for two hours under air sparge with 25 g. of 2-hydroxypropyl methacrylate containing 0.09 g. of 2,6-di-tert-butyl-p-cresol as stabilizer.

Seventy parts of this prepolymer are added to 12 parts of 2-hydroxypropyl methacrylate, 16 parts of n-butyl acrylamide, 2 parts of acrylamide, 0.04 part of di-tert-butyl-p-cresol, 0.04 part of hydroquinone methyl ether and 1.8 parts of benzoin isobutyl ether. This composition, designated as polyurethane I, is doctored as a 40 mil layer onto a photographic negative which is covered by a protective film. The layer is photocured by a 30 second exposure with BL-F-20T12 fluorescent lamps (General Electric) followed by a 120 second exposure with a 2 Kw medium pressure mercury arc lamp. The photocured plate has a tensile strength of 1900 lbs./in.$^2$, hardness of 68A, modulus of 1300 lbs./in.$^2$ and elongation of 155%.

An unsaturated polyester prepolymer (II) having an average molecular weight of 3,100 and an acid number of 18 is prepared by reacting under an inert atmosphere of nitrogen gas, 33.5 parts of diethylene glycol, 5.1 parts of propylene glycol, 9.76 parts of fumaric acid, 21 parts of phthalic anhydride and 30.7 parts of adipic acid at a maximum temperature of 190° C. for about 10 hours in the presence of 0.5 g. of p-toluenesulfonic acid as catalyst and 0.2 g. of hydroquinone anti-gelation agent.

This unsaturated polyester (100 parts) is added to 50 parts of styrene, 50 parts of triethylene glycol dimethacrylate, 0.07 part of di-tert-butyl-p-cresol, 0.03 part of methyl ether of hydroquinone and 1.1 parts of alpha, alpha-dimethoxyphenylacetophenone. This unsaturated polyester composition, designated as unsaturated polyester II, when photopolymerized as described above has a hardness of 67A, a modulus of 990 lb./in.$^2$, a tensile strength of 370 lb/in.$^2$ and an elongation of 35%.

A blend of polyurethane I composition and unsaturated polyester II composition is made by mixing 50 parts of each composition. The blend, when fully cured by actinic radiation as described above, has a hardness of 70A, a tensile strength of 890 lb./in.$^2$, an elongation of 70% and a modulus of 1610 lb./in.$^2$. These data show that the cured blend has strength and elongation substantially higher than that of the unsaturated polyester II alone.

Printing plates made from the above described blend are developed by spray washing for two minutes with a 0.5% sodium hydroxide aqueous solution and an additional 30 seconds with water. The plates exhibited considerably less tack in its background areas than plates prepared from the polyurethane I composition alone.

Printing plates made from polyurethane I composition alone swell and disintegrate after a relatively short use (less than 5000 impressions) on a press when ultraviolet curable inks (i.e., prepared by dispersing a pigment in a polymer-acrylate monomer mixture) are used. Printing plates made from unsaturated polyester II composition alone are subject to character chipping and breakage during printing with the above inks and during plate cleaning such that less than 5000 impresssions can be obtained. Printing plates prepared from a blend of polyurethane I and unsaturated polyester II compositions are not subject to plate swelling or plate breakdown when using ultraviolet curable ink, even after 100,000 impressions.

EXAMPLE 2

This example illustrates a photopolymerizable composition containing a blend of a polyester-polyether urethane-linked block copolymer and an unsaturated polyester, and the use of the photopolymerizable composition to make printing plates.

A blend is prepared by dissolving 38.5 parts of the liquid polyester-polyether urethane-linked block copolymer (I) described above in Example 1, and 38.5 parts of the liquid unsaturated polyester (II) described in Example 1 in 50 parts of styrene, 50 parts of triethyleneglycol dimethacrylate, 0.07 part of di-tert-butyl-p-cresol, 0.03 part of methyl ether of hydroquinone and 1.1 parts of alpha, alpha-dimethoxyacetophenone. When this blend (viscosity 3840 cps) is fully cured, as described in Example 1, a cross-linked polymer having a hardness of 70A, a tensile strength of 628 psi, an elongation of 105%, a modulus of 2400 psi.

EXAMPLE 3

This example illustrates a photopolymerizable composition containing a blend of a polyester-polyether urethane-linked block copolymer and an unsaturated polyester, and the use of the photopolymerizable composition to make printing plates.

Fifty parts of polyurethane I composition described in Example 1 are blended with 50 parts of an unsaturated polyester composition, designated unsaturated polyester III, which contains 100 parts of the unsaturated polyester prepolymer (II) described in Example 1, 30 parts styrene, 5 parts triethyleneglycol dimethacrylate, 10 parts polyethyleneglycol dimethacrylate (molecular weight 425), 0.07 part di-tert-butyl-p-cresol, 0.03 part methyl ether of hydroquinone and 1.8 part benzoin isobutyl ether. Unsaturated polyester III composition, when cured as described in Example 1, has a tensile strength of 490 psi, elongation of 80%, hardness of 70A and a modulus of 1090 psi. The blend of polyurethane I composition and unsaturated polyester III composition, when cured as described in Example 1, has a tensile strength of 800 psi, elongation of 110%, modulus of 1440 psi and hardness of 67A.

EXAMPLE 4

This example illustrates a photopolymerizable composition containing a blend of a polyester-polyether urethane-linked block copolymer and an unsaturated polyester, and the use of the photopolymerizable composition to make printing plates.

A polyester-polyether urethane-linked block copolymer (I) is prepared as described in Example 1. To 70 parts of this prepolymer (I) are added 10 parts of triethyleneglycol dimethacrylate, 16 parts n-butyl acrylamide, 4 parts methyl methacrylate, 0.3 part or hydroquinone methyl ether, 0.3 part of di-tert-butyl-p-cresol, 0.3 part of alpha, alpha-dimethoxyphenylacetophenone and 1.8 parts of benzoin isobutyl ether. This composition is designated polyurethane IV composition and, when fully cured by actinic radiation as described in Example 1, has a tensile strength of 2700 psi, 35% elongation, a modulus of 18,300 psi and hardness of 45D.

An unsaturated polyester prepolymer (II) is prepared as described in Example 1. To 63 parts of this unsaturated polyester (II) are added 26.7 parts of tetraethyleneglycol dimethacrylate, 5.6 parts of 2-hydroxyethyl methacrylate, 10.1 parts of diallylphthalate, 0.08 part di-tert-butyl-p-cresol, 0.04 part hydroquinone methyl ether, 1.8 parts of benzoin isobutyl ether and 8 parts Bakelite phenoxy resin (Union Carbide) as viscosity modifier. This composition, designated unsaturated polyester V composition, has a viscosity of 5740 cps and, when fully cured by actinic radiation, as described in Example 1, a tensile strength of 830 psi, hardness of 88A, elongation of 25%, modulus of 6900 psi and a peel strength of 4.6 lbs./in. width.

Fifty parts of polyurethane IV composition are blended with 50 parts of unsaturated polyester V composition. This blend has a viscosity of 7160 cps and, when fully cured by actinic radiation, as described in Example 1, a hardness of 35D, tensile strength of 1120 psi, elongation of 20%, and modulus of 13,000 psi.

EXAMPLE 5

This example illustrates the preparation of a multilayer printing plate having layers of differing hardness using a photopolymerizable composition containing a blend of a polyester-polyether urethane-linked block copolymer and an unsaturated polyester as one of the layers.

A multilayer printing plate is prepared as follows: four to five mils of liquid unsaturated polyester VI composition, prepared by dissolving 100 parts of unsaturated polyester VI prepolymer (prepared from 2 moles of diethylene glycol, 2 moles of propylene glycol, 2 moles of adipic acid and 2 moles of fumaric acid) in 45 parts triethylene glycol dimethacrylate, 15 parts N-3-oxobutylacrylamide, 0.038 part of di-tert-butyl p-cresol, 0.02 part of the methyl ether of hydroquinone and 0.5 part benzoin isobutyl ether is doctored onto a 0.75 mil polypropylene film covering a Bychrome screen negative. Then 8–9 mils of a liquid photopolymer resin containing a blend of 38.5 parts of unsaturated polyester VII prepolymer (prepared from 1 mole diethylene glycol, 1 mole propylene glycol, 0.5 mole fumaric acid, 0.5 mole phthalic anhydride, and 1 mole adipic acid) and 41.08 parts of polyester-polyether urethane-linked block copolymer (I) from Example 1, both dissolved in 16 parts n-butyl acrylamide, 12 parts 2-hydroxyethyl methacrylate, 5 parts styrene, 2 parts acrylamide, 0.04 part di-tert-butyl p-cresol, 0.04 part methyl ether of hydroquinone, 0.65 part benzoin isobutyl ether and 0.55 part alpha, alpha-dimethoxyphenylacetophenone (which yields a polymer of hardness 61A and 760 modulus when photocured) is doctored over the unsaturated polyester VI composition layer.

A Mylar backing sheet approximately 4 mils thick is coated with an adhesive solution containing a red dye as an antihalation agent. This backing sheet is laid over the above liquid resin layers and the whole is irradiated for 10 seconds through the backing sheet with GE F20T12 BL fluorescent lamps (of intensity 1.2 mwatt/cm² as measured by an Ultraviolet Back-Ray meter). The resin sandwich is then irradiated through the negative for 80 seconds with a 2000 watt medium pressure mercury arc lamp (at an intensity of 7 mwatt/cm²). After exposure, the polypropylene film is stripped away and the unexposed polymer removed by spray washing for 2 minutes with a 0.5% sodium hydroxide aqueous solution and an additional 30 seconds with water. The dry plate is exposed for 10 minutes under a nitrogen blanket with fluorescent lamps (of 1.2 mwatt/cm² intensity).

What I claim and desire to protect by Letters Patent is:

1. A photopolymerizable composition comprising:
    (A) about 10% to about 45% by weight of a liquid polymer having the formula:

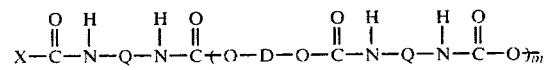

-continued

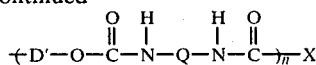

where m and n are integers from 0 to 10 and m+n is at least 1, D and D' are polymeric backbones selected from hydroxy terminated homopolymers of butadiene, isoprene, chloroprene, styrene, isobutylene, ethylene, epichlorohydrin, ethylene glycol, propylene glycol or neopentyl glycol; or hydroxy terminated copolymers of butadiene and acrylonitrile, butadiene and styrene, butadiene and isoprene, ethylene and neohexene, isobutylene and styrene, isobutylene and acrylonitrile; hydroxy terminated polyesters of saturated or unsaturated dibasic acids and saturated or unsaturated glycols; hydroxy terminated polyester-polyether block copolymers; or combinations of such polymeric backbones; Q is a radical selected from $C_4$-$C_{10}$ alkylene, $C_5$-$C_8$ cycloalkylene, arylene containing 1-2 rings, $C_6$-$C_{12}$ alkarylene, and alkylene oxyalkylene radicals containing 4-8 carbon atoms and 1-3 oxygen atoms; X is selected from the radical of an alcohol containing one to three ethylenically unsaturated bonds from which a hydrogen atom has been removed from the hydroxyl group, the radical of a primary or secondary alkyl or aralkyl amine containing unsaturation in the alkyl group, from which a hydrogen atom has been removed from the amine group, or the radical of a carboxylic acid selected from acrylic acid and methacrylic acid from which the hydrogen atom on the carboxyl group has been removed;
- (B) about 10% to about 45% by weight of a liquid unsaturated polyester produced from an alcoholic component comprising at least one polyol, and an acid component selected from at least one dicarboxylic acid, dianhydride or diester, at least one of said alcoholic and acid components being unsaturated;
- (C) about 5% to about 55% by weight of at least one ethylenically unsaturated, addition polymerizable monomer;
- (D) about 0.05% to about 4% by weight of a photoinitiator; and
- (E) about 0.01% to about 0.2% by weight of at least one thermal polymerization inhibitor, all percentages being based on the total weight of the liquid polymer components and the ethylenically unsaturated monomer component.

2. The photopolymerizable composition of claim 1 wherein the liquid polymer (A) has polymeric backbones D and D' selected from hydroxy terminated homopolymers of butadiene, isoprene, chloroprene, styrene, isobutylene, and ethylene; or hydroxy terminated copolymers of butadiene and acrylonitrile, butadiene and styrene, butadiene and isoprene, ethylene and neohexene, isobutylene and styrene, isobutylene and acrylonitrile or combinations of such backbones.

3. The photopolymerizable composition of claim 1 wherein the liquid polymer (A) has polymeric backbones D and D' selected from hydroxy terminated homopolymers of epichlorohydrin, ethylene glycol, propylene glycol and neopentyl glycol; or hydroxy terminated polyesters of saturated or unsaturated dibasic acids and saturated or unsaturated glycols; hydroxy terminated polyester-polyether block copolymers; or combinations of such polymeric backbones.

4. A photopolymer element for use with inks which contain acrylate monomers which are cured by ultraviolet radiation comprising a support and a layer comprising the photopolymerizable composition of claim 1.

5. The process of making a printing relief for use with inks which contain acrylate monomers which are cured by ultraviolet radiation, said process comprising: (1) admixing the components of the photopolymerizable composition of claim 1, (2) spreading the photopolymerizable composition in a layer on a support to form a photopolymer element, (3) exposing to actinic light selected areas of said layer on said support until substantial cross-linking takes place on the exposed areas without significant cross-linking in the unexposed areas, and (4) removing the unexposed areas of photopolymerizable compositions by washing the photopolymer element with an aqueous detergent solution.

6. A photopolymerizable composition comprising:
- (A) about 10% to about 45% by weight of a liquid polymer containing at least two terminal olefinically unsaturated groups linked by a carbamoyl linkage to a hydroxy-terminated polymer;
- (B) about 10% to about 45% by weight of a liquid unsaturated polyester produced from an alcoholic component comprising at least one polyol, and an acid component selected from at least one dicarboxylic acid, dianhydride or diester, at least one of said alcoholic and acid components being unsaturated;
- (C) about 5% to about 55% by weight of at least one ethylenically unsaturated, addition polymerizable monomer;
- (D) about 0.05% to about 4% by weight of a photoinitiator; and
- (E) about 0.01% to about 0.2% by weight of at least one thermal polymerization inhibitor, all percentages being based on the total weight of the liquid polymer components and the ethylenically unsaturated monomer component.

* * * * *

UNITED STATES PATENT AND TRADEMARK OFFICE
CERTIFICATE OF CORRECTION

PATENT NO. : 4,198,238
DATED : April 15, 1980
INVENTOR(S) : Bernard J. Scheve

It is certified that error appears in the above-identified patent and that said Letters Patent are hereby corrected as shown below:

Column 4, between lines 42 & 48 "
$$CH_2=\underset{R}{C}-\overset{O}{\overset{\|}{C}}-X-A-X-\overset{O}{\overset{\|}{C}}-\underset{I R}{C}=CH_2$$
"

should read --
$$CH_2=\underset{R}{C}-\overset{O}{\overset{\|}{C}}-X-A-X-\overset{O}{\overset{\|}{C}}-\underset{R}{C}=CH_2$$
--.

Column 5 between lines 40 & 43 "
$$-CH_2-O\overset{O}{\overset{\|}{C}}=C=CH_2, \text{ or } -O-\overset{O}{\overset{\|}{C}}-\underset{R}{C}=CH_2$$
"

should read --
$$-CH_2-O\overset{O}{\overset{\|}{C}}-\underset{R}{C}=CH_2, \text{ or } -O-\overset{O}{\overset{\|}{C}}-\underset{R}{C}=CH_2$$
--.

Signed and Sealed this

Twenty-second Day of July 1980

[SEAL]

Attest:

SIDNEY A. DIAMOND

*Attesting Officer*     *Commissioner of Patents and Trademarks*